United States Patent
Kobata

(10) Patent No.: US 7,508,281 B2
(45) Date of Patent: Mar. 24, 2009

(54) FREQUENCY SYNTHESIZER

(75) Inventor: Tsukasa Kobata, Hokkaido (JP)

(73) Assignee: Nihon Dempa Kogyo., Ltd, Tokyo (JP)

( * ) Notice: Subject to any disclaimer, the term of this patent is extended or adjusted under 35 U.S.C. 154(b) by 81 days.

(21) Appl. No.: 11/819,713

(22) Filed: Jun. 28, 2007

(65) Prior Publication Data

US 2008/0007353 A1    Jan. 10, 2008

(30) Foreign Application Priority Data

Jun. 29, 2006  (JP) .................... P. 2006-180364
May 25, 2007  (JP) .................... P. 2007-139536

(51) Int. Cl.
*H03L 7/085*  (2006.01)
*H03L 7/095*  (2006.01)
*H03L 7/18*   (2006.01)

(52) U.S. Cl. ........................ 331/182; 327/156

(58) Field of Classification Search ............ 331/182, 331/4, 25, 178; 327/156, 159, 107
See application file for complete search history.

(56) References Cited

U.S. PATENT DOCUMENTS 5,444,420 A    8/1995  Wernlund
5,539,346 A *  7/1996  Goto ..................... 327/156
6,252,464 B1   6/2001  Richards et al.
2002/0084856 A1 7/2002 Von Dolteren, Jr.

FOREIGN PATENT DOCUMENTS

| EP | 1 584 929 | 10/2005 |
| JP | H05-22131 | 1/1993 |
| JP | H07-201137 | 8/1995 |

OTHER PUBLICATIONS

European Search Report dated Oct. 26, 2007.

* cited by examiner

*Primary Examiner*—Daniel D Chang
(74) *Attorney, Agent, or Firm*—Jacobson Holman PLLC

(57) ABSTRACT

Disclosed is a frequency synthesizer capable of preventing occurrence of a frequency shift upon occurrence of a change in the level of an input to an A/D converter by preventing PLL control from being properly operated. The frequency synthesizer includes a carrier remove, an inverse rotational vector multiplier, a phase time difference detector, an adder, a phase difference accumulator, a loop filter, a parameter output part, an amplitude information detector, a filter, and a multiplier configured by an FPGA. Unlock detection means monitors the value of amplitude information detected by the amplitude information detector. When the value lies within a proper range, a lock (synchronization) process is performed under PLL control, whereas when the value is off the proper range, an unlock state in PLL control is detected.

6 Claims, 3 Drawing Sheets

FIG.3

| ADC INPUT LEVEL (0toP) [STEP] | FREQUENCY ERROR [Hz] |
|---|---|
| 3307 (80%) | -48.331 |
| 3721 (90%) | -25.479 |
| 4134 (REFERENCE) | 0 |
| 4547 (110%) | +28.159 |
| 4961 (120%) | +59.074 |

FREQUENCY SYNTHESIZER

BACKGROUND OF THE INVENTION

1. Field of the Invention

The present invention relates to a frequency synthesizer which provides an oscillation output of a desired frequency, and, more particularly, relates to a frequency synthesizer capable of preventing occurrence of a frequency shift upon occurrence of a change in the level of an input to an A/D (Analog-Digital) converter by preventing a situation where PLL (Phase Locked Loop) control does not work properly.

2. Description of the Related Art

A conventional frequency synthesizer will be described referring to FIG. 2. FIG. 2 is a configuration block diagram of the conventional frequency synthesizer.

As shown in FIG. 2, the conventional frequency synthesizer has a VCO (Voltage Controlled Oscillator) 1, a frequency divider 2, a reference oscillation circuit 3, an A/D converter 4, a phase comparator 5, a digital filter 6, a D/A (Digital/Analogue) converter 7, and an analog filter 8.

The VCO 1 is a voltage controlled oscillator that generates a desired frequency Fout in response to an input from the analog filter 8 as a control voltage.

The frequency divider 2 divides the oscillation frequency Fout generated by the VCO 1 to 1/N, and sends the resultant frequency to the A/D converter 4.

The reference oscillation circuit 3 generates a reference signal (reference clock) Fref.

The A/D converter 4 converts an analog signal from the frequency divider 2 to a digital signal according to the reference clock supplied from the reference oscillation circuit 3.

The phase comparator 5 compares the phase of the digital signal from the A/D converter 4 with the phase of the reference signal from the reference oscillation circuit 3, and outputs a phase difference signal.

The digital filter 6 filters the phase difference signal from the phase comparator 5.

The D/A converter 7 converts the digital signal from the digital filter 6 to an analog signal according to the reference clock supplied from the reference oscillation circuit 3.

The analog filter 8 is a loop filter which smooths the analog signal from the D/A converter 7 to cancel the noise component, and outputs the analog signal as a control voltage to the VCO 1.

Japanese Patent Application Laid-Open No. H05-22131 (Patent Document 1) describes a lock detection circuit for a PLL circuit, which monitors a first PLL value and a second PLL value in a PLL frequency synthesizer to detect a lock state.

Japanese Patent Application Laid-Open No. H07-201137 (Patent Document 2) describes a lock detection method and a lock detection apparatus for a phase synchronization loop, which monitor the count of an A/D value from a VCO to detect a lock state or an unlock state.

When the level of an input to the A/D converter in the conventional frequency synthesizers changes significantly, however, the PLL control in the phase comparator may not work properly, resulting in occurrence of a frequency shift.

Specifically, as shown in FIG. 3, when the level of the input to the ADC (A/D converter) has a signal amplitude of 0 to P (Peak) set in standard 4134 steps, a frequency error is 0 Hz, whereas when the input level is 90% and 80%, the frequency error increases in the negative side, or when the input level is 110% and 120%, the frequency error increases in the positive side.

It is apparent that there arises a problem such that when the ADC input level varies considerably with respect to the reference value, the frequency error becomes greater.

While the technique of the Patent Document 1 outputs information indicating that a PLL circuit is unlocked before the PLL circuit is actually unlocked, the technique does not prevent a frequency shift in the digital phase comparator from occurring with respect to a change in the level of the input to the A/D converter.

The technique of the Patent Document 2 converts a reproduction signal to a digital signal in synchronism with a sampling clock based on a clock which is reproduced in the phase synchronization loop, at least two sample values near the edges of a clock pattern in those sample values which correspond to the clock pattern, counts the number of the same comparison results, detects a lock state when the number is equal to or greater than a predetermined threshold value, and detects a non-lock state when the number of the same comparison results after inversion of the comparison result in the lock state is equal to or greater than the predetermined threshold value. Because the comparison targets are delayed input signals, however, the conventional technique does not prevent a frequency shift with respect to a change in the level of the input to the A/D converter.

SUMMARY OF THE INVENTION

The present invention has been made in consideration of the aforementioned situation, and it is an object of the invention to provide a frequency synthesizer capable of preventing occurrence of a frequency shift upon occurrence of a change in the level of an input to an A/D converter by preventing a situation where PLL control does not work properly.

To overcome the problem of the conventional techniques, a frequency synthesizer according to the present invention comprises a voltage controlled oscillator that generates a frequency signal according to an input control voltage; a frequency divider that divides the generated frequency signal; an A/D converter that performs analog-to-digital conversion of the divided signal; a phase comparator that compares a phase of the A/D-converted signal with a phase of a reference signal to detect a phase difference, and outputs a phase difference signal according to the phase difference; a D/A converter that performs digital-to-analog conversion of the phase difference signal; and a loop filter that cancels a high-frequency noise, wherein the phase comparator includes, as an automatic gain control circuit, a multiplier provided at a subsequent stage of the A/D converter and an amplitude information detector that detects amplitude information for controlling a gain of the multiplier, and unlock detection means that monitors a value of the amplitude information and detects an unlock state when the value falls within a specific range. The frequency synthesizer makes it possible to prevent a frequency shift from occurring.

According to the present invention, the phase comparator includes a carrier remove that performs quadrature detection of an output from the A/D converter to acquire a rotational vector which rotates with a frequency difference between an output signal from the A/D converter and a detection signal; an inverse rotational vector multiplier that multiplies a rotational vector by an inverse rotational vector; a phase time difference detector that detects a phase difference every sampling time based on the rotational vector reduced by multiplication; an adder that subtracts a fine adjustment frequency from the detected phase difference; and a phase difference accumulator that accumulates an output from the adder for a given time, and the unlock detection means monitors the value of the amplitude information acquired by the amplitude information detector to which an output from the inverse rotational vector multiplier is branched and input. Unlock detection can be executed according to the value of the phase difference based on the signal subjected to quadrature detection.

BRIEF DESCRIPTION OF THE DRAWINGS

FIG. 3 is a diagram showing an ADC input level and a frequency error.

DESCRIPTION OF REFERENCE NUMERALS

Figure 1:
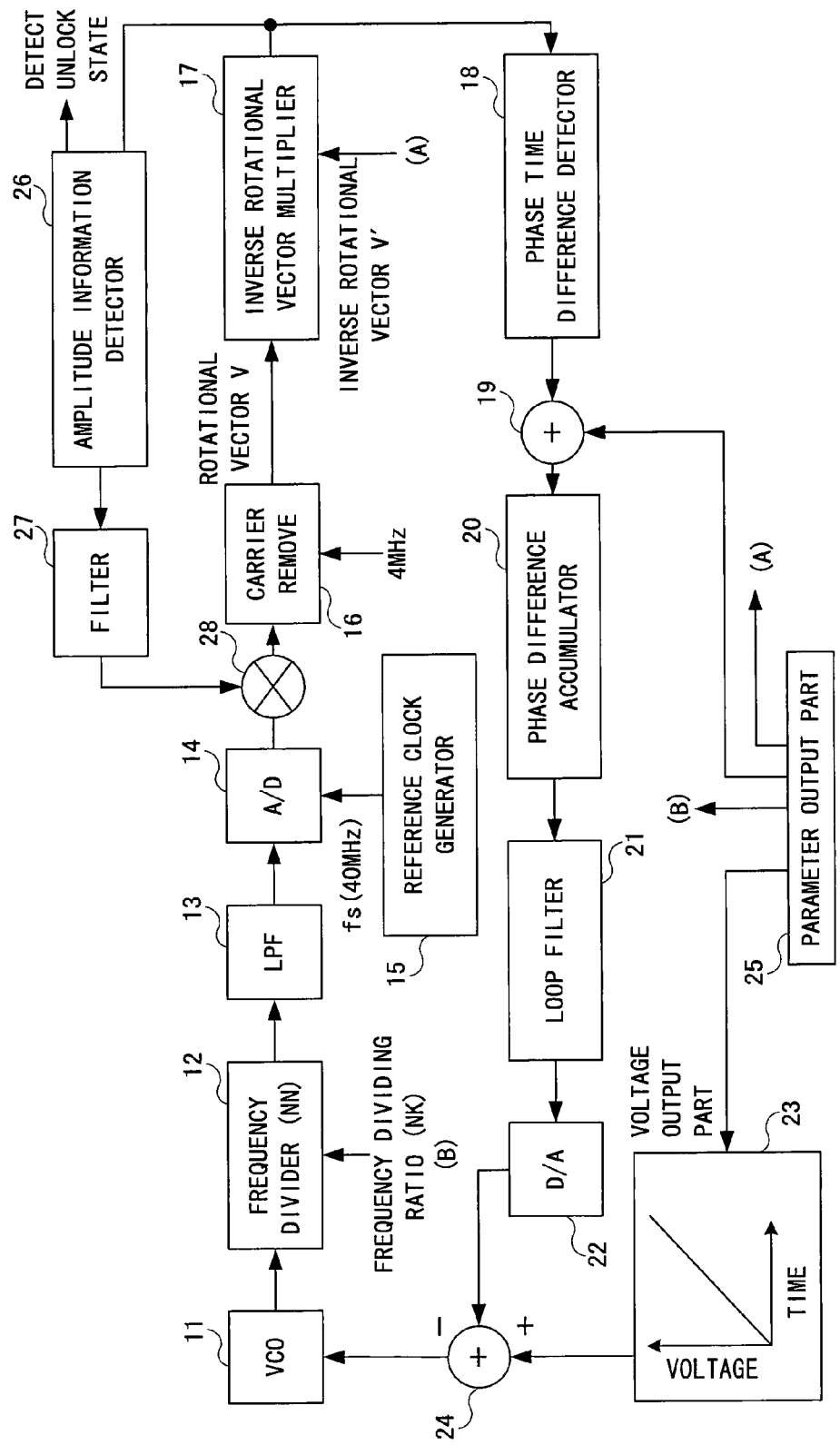
FIG. 1 is a configuration block diagram of a frequency synthesizer according to an embodiment of the present invention.
Figure 2:
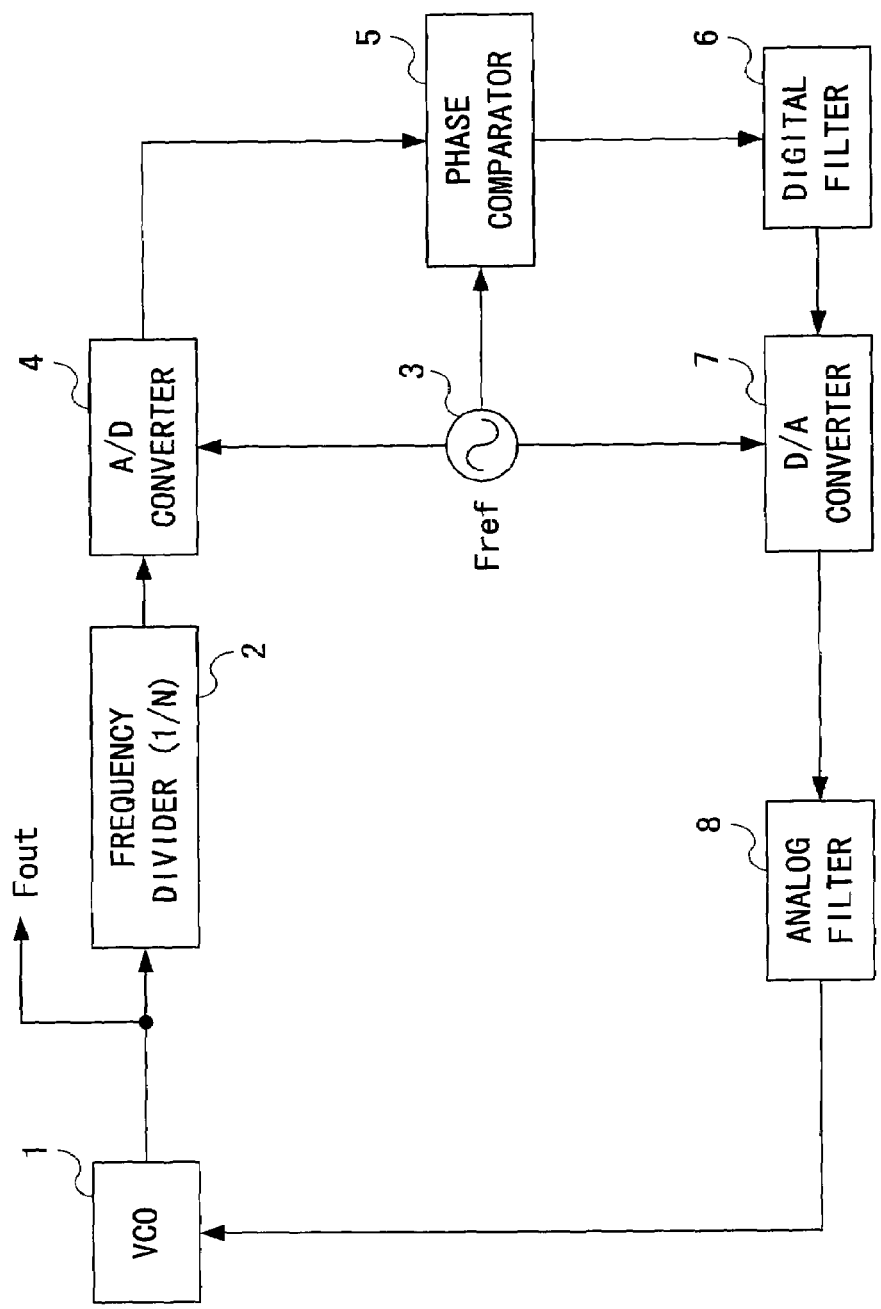
FIG. 2 is a configuration block diagram of the conventional frequency synthesizer.

1: VCO
2: frequency divider
3: reference oscillation circuit
4: A/D converter
5: phase comparator
6: digital filter
7: D/A converter
8: analog filter
11: VCO
12: frequency divider
13: LPF
14: A/D converter
15: reference clock generator
16: carrier remove
17: inverse rotational vector multiplier
18: phase time difference detector
19: adder
20: phase difference accumulator
21: loop filter
22: D/A converter
23: voltage output part
24: adder
25: parameter output part

DETAILED DESCRIPTION OF THE PREFERRED EMBODIMENT

[Outline of the Invention]
A preferred embodiment of the present invention will be described below referring to the accompanying drawings.

A frequency synthesizer according to the embodiment of the present invention includes an automatic gain control circuit (AGC) in order to make an output level from an A/D converter constant, and determines an input level to the A/D converter based on an AGC correction value. When the AGC correction value lies within a proper range, it performs a lock (synchronization) process under PLL control in parallel with a gain control at the output of the AD converter with the AGC, and when the value is off the proper range, it detects an unlock state under PLL control thus making it possible to prevent a frequency shift.

[Configuration of Embodiment: FIG. 1]
The frequency synthesizer according to the embodiment of the present invention will be described referring to FIG. 1. FIG. 1 is a configuration block diagram of the frequency synthesizer according to the embodiment of the present invention.

The frequency synthesizer according to the embodiment of the present invention (present frequency synthesizer), as shown in FIG. 1, includes a VCO 11, a frequency divider (NN) 12, an LPF (Low Pass Filter) 13, an A/D converter 14, a reference clock generator 15, a D/A converter, a voltage output part 23, an adder 24, and a carrier remove 16, an inverse rotational vector multiplier 17, a phase time difference detector 18, an adder 19, a phase difference accumulator 20, a loop filter 21, a parameter output part 25, an amplitude information detector 26, a filter 27 and a multiplier 28, which are configured by an FPGA (Field Programmable Gate Array).

The amplitude information detector 26, the filter 27 and the multiplier 28 constitute an automatic gain control (AGC) circuit.

The VCO 11 is a voltage controlled oscillator that generates a desired frequency (450 MHz to 1000 MHz) in response to an input from the adder 24 as a control voltage.

The frequency divider (NN) 12 divides the output of the VCO 11 to 1/NN based on a frequency dividing value (NN) externally input, and sends the resultant value to the LPF 13.

The LPF 13 is a filter that pass a low-frequency component of the signal divided by the frequency divider 12.

The A/D converter 14 performs analog-to-digital conversion on the signal from the LPF 13 by sampling the signal with a clock of 40 MHz (fs) from the reference clock generator 15, and outputs the resultant signal to the carrier remove 16 of the FPGA.

The D/A converter 22 performs digital-to-analog conversion of a control signal adjusted by the FPGA. A signal voltage from the D/A converter 22 is in a range of 0 to 0.85 V.

The voltage output part 23 outputs a voltage based on a voltage value from the parameter output part 25, and is configured in such a way that the output voltage rises to a predetermined voltage linearly, for example, as the time passes.

The adder 24 corrects the voltage output from the voltage output part 23 with a control signal output from the D/A converter 22, and outputs the corrected voltage as a control voltage to the VCO 11.

The fundamental function of the FPGA is to detect a phase difference by comparing the rotational vector at the desired output frequency (set frequency) with the rotational vector of the signal from the A/D converter 14, and generate the control signal which controls the oscillation frequency of the VCO 11 based on the phase difference.

The carrier remove 16 performs quadrature detection of a sinusoidal signal specified by the digital signal from the A/D converter 14 to acquire a rotational vector V which rotates with the frequency of the difference between a frequency signal specified by the digital signal from the A/D converter 14 and the frequency of a sinusoidal signal to be used in detection.

The inverse rotational vector multiplier 17 multiplies the rotational vector V by an inverse rotational vector V' output from the parameter output part 25.

The phase time difference detector 18 detects a phase difference every sampling time based on the rotational vector V reduced by the inverse rotational vector multiplier 17. The phase difference becomes a value corresponding to the frequency of the reduced rotational vector V. When the phase difference becomes zero, the phase time difference detector 18 detects a lock state in PLL, and sends out a lock detection signal.

The adder 19 subtracts the value of a fine adjustment frequency to make the frequency approach a desired oscillation frequency calculated beforehand, from the output of the phase time difference detector 18.

The phase difference accumulator 20 accumulates the output from the adder 19 for a given time, and outputs the accumulated value. The phase difference accumulator 20 comprises a filter to set the dumping to the optimal value.

The carrier remove 16, the inverse rotational vector multiplier 17, the phase time difference detector 18, the adder 19, the phase difference accumulator 20 and the parameter output part 25 are equivalent to a phase comparator described in the appended claims.

The loop filter 21 generates data to control the VCO 11 based on the accumulated value from the phase difference accumulator 20, and outputs the data as a control signal. The loop filter 21 is controlled based on the accumulated value in order to stabilize the output of the loop filter 21.

Based on input frequency setting information (information on the desired oscillation frequency), the parameter output part 25 calculates the frequency dividing value (NN), the inverse rotational vector V' to the inverse rotational vector multiplier 17, the fine adjustment frequency to the adder 19, and the voltage value to the voltage output part 23 as frequency parameters, and outputs the parameters at calculated timings. The inverse rotational vector V' is calculated based on the rotational vector V and the frequency setting information. The parameter output part 25 may store various parameters in a table or the like beforehand, and read the parameters therefrom.

The amplitude information detector 26 receives the output of the inverse rotational vector multiplier 17, performs an operation of $I^2+Q^2$ where I is the real of the rotational vector and Q is an imaginary part thereof, and outputs an AGC correction value, acquired from the operation result (amplitude information), to the filter 27. Based on the amplitude information, the correction value in the AGC circuit is acquired.

The amplitude information detector 26 has a controllable input amplitude range determined, has unlock detection means provided inside, and has a threshold value (the value of amplitude information at which the PLL control does not work properly) set. The unlock detection means determines whether or not the input amplitude exceeds the threshold value. When the input amplitude exceeds the threshold value, the unlock detection means outputs an unlock detection signal to perform asynchronous unlock process.

Although unlock detection is executed based on the value of the amplitude information, unlock detection may be executed based on the AGC correction value acquired based on the amplitude information.

The filter 27 sends the multiplier 28 the gain with such a characteristic as to provide the adequate automatic gain control with respect to the amplitude information acquired by the amplitude information detector 26.

The multiplier 28 multiplies the output of the A/D converter 14 by the output (gain) of the filter 27, and sends the resultant output to the carrier remove 16. The multiplication of the gain in the multiplier 28 is adjusted in such a way that the amplitude information always becomes constant.

Next, the feature of the present frequency synthesizer will be described specifically.

In the present frequency synthesizer, though not illustrated, the unlock detection means in the amplitude information detector 26 monitors the value of the amplitude information, determines whether or not the value of the amplitude information becomes a value in a specific range (the value in a preset range=the value in a range where PLL does not work properly), and detects an unlock state when the value of the amplitude information falls within the specific range.

While the unlock detection means may be provided in the amplitude information detector 26, it may be provided in the FPGA independently or provided in another control circuit in the FPGA.

In the present frequency synthesizer, as apparent from the above, when the level of the input to the A/D converter 14 changes, the unlock detection means determines based on the value of the amplitude information, acquired by the amplitude information detector 26, whether or not the level of the input to the A/D converter 14 lies within the range where PLL control does not work properly, and detects an unlock state when the PLL control does not work properly.

In the frequency synthesizer, the unlock detection means monitors the maximum value or the minimum value of the value to be input to the filter 27 from the value of the amplitude information acquired by the amplitude information detector 26, and detects an unlock state when the maximum value becomes equal to or greater than a first specific value or when the minimum value becomes equal to or smaller than a second specific value.

That is, when the level of the output signal of the A/D converter 14 falls within a preset range (range where PLL control does not work properly), the present frequency synthesizer may detect the event as an unlock state and carry out alarm detection (outputting an alarm sound or alarm display).

The present frequency synthesizer brings about an effect such that when the level of the input to the A/D converter 14 exceeds the normal operational range of PLL control, an unlock state is detected, thereby preventing occurrence of a frequency shift.

The present invention is suitable for a frequency synthesizer which can prevent occurrence of a frequency shift by preventing a situation where PLL control does not work properly, when the level of the input to the A/D converter 14 changes.

What is claimed is:

1. A frequency synthesizer comprising:
 a voltage controlled oscillator that generates a frequency signal according to an input control voltage;
 a frequency divider that divides the generated frequency signal;
 an A/D converter that performs analog-to-digital conversion of the divided signal;
 a phase comparator that compares a phase of the A/D-converted signal with a phase of a reference signal to detect a phase difference, and outputs a phase difference signal according to the phase difference;
 a D/A converter that performs digital-to-analog conversion of the phase difference signal; and
 a loop filter that cancels a high-frequency noise,
 wherein the phase comparator includes, as an automatic gain control circuit, a multiplier provided at a subsequent stage of the A/D converter and an amplitude information detector that detects amplitude information for controlling a gain of the multiplier, and unlock detection means that monitors a value of the amplitude information and detects an unlock state when the value falls within a specific range.

2. The frequency synthesizer according to claim 1, wherein the unlock detection means monitors a maximum value of the amplitude information detected by the amplitude information detector in the automatic gain control circuit, and detects an unlock state when the maximum value becomes equal to or greater than a first specific value.

3. The frequency synthesizer according to claim 1, wherein the unlock detection means monitors a minimum value of the amplitude information detected by the amplitude information detector in the automatic gain control circuit, and detects an unlock state when the minimum value becomes equal to or smaller than a second specific value.

4. The frequency synthesizer according to claim 1, wherein the phase comparator includes:
- a carrier remove that performs quadrature detection of an output from the A/D converter to acquire a rotational vector which rotates with a frequency difference between an output signal from the A/D converter and a detection signal;
- an inverse rotational vector multiplier that multiplies a rotational vector by an inverse rotational vector;
- a phase time difference detector that detects a phase difference every sampling time based on the rotational vector reduced by multiplication;
- an adder that subtracts a fine adjustment frequency from the detected phase difference; and
- a phase difference accumulator that accumulates an output from the adder for a given time, and
- the unlock detection means monitors the value of the amplitude information acquired by the amplitude information detector to which an output from the inverse rotational vector multiplier is branched and input.

5. The frequency synthesizer according to claim 2, wherein the phase comparator includes:
- a carrier remove that performs quadrature detection of an output from the A/D converter to acquire a rotational vector which rotates with a frequency difference between an output signal from the A/D converter and a detection signal;
- an inverse rotational vector multiplier that multiplies a rotational vector by an inverse rotational vector;
- a phase time difference detector that detects a phase difference every sampling time based on the rotational vector reduced by multiplication;
- an adder that subtracts a fine adjustment frequency from the detected phase difference; and
- a phase difference accumulator that accumulates an output from the adder for a given time, and
- the unlock detection means monitors the value of the amplitude information acquired by the amplitude information detector to which an output from the inverse rotational vector multiplier is branched and input.

6. The frequency synthesizer according to claim 3, wherein the phase comparator includes:
- a carrier remove that performs quadrature detection of an output from the A/D converter to acquire a rotational vector which rotates with a frequency difference between an output signal from the A/D converter and a detection signal;
- an inverse rotational vector multiplier that multiplies a rotational vector by an inverse rotational vector;
- a phase time difference detector that detects a phase difference every sampling time based on the rotational vector reduced by multiplication;
- an adder that subtracts a fine adjustment frequency from the detected phase difference; and
- a phase difference accumulator that accumulates an output from the adder for a given time, and
- the unlock detection means monitors the value of the amplitude information acquired by the amplitude information detector to which an output from the inverse rotational vector multiplier is branched and input.

* * * * *